US008368631B2

(12) United States Patent
Lee et al.

(10) Patent No.: US 8,368,631 B2

(45) Date of Patent: Feb. 5, 2013

(54) DRIVING INTEGRATED CIRCUIT AND METHODS THEREOF

(75) Inventors: Cheol-Ha Lee, Suwon-si (KR); Young-Ju Choi, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1201 days.

(21) Appl. No.: 11/709,801

(22) Filed: Feb. 23, 2007

(65) Prior Publication Data

US 2007/0257898 A1 Nov. 8, 2007

(30) Foreign Application Priority Data

Feb. 24, 2006 (KR) ........................ 10-2006-0018425

(51) Int. Cl.
*G09G 3/36* (2006.01)
*G09G 5/39* (2006.01)
*G06F 12/02* (2006.01)
*G11C 7/00* (2006.01)

(52) U.S. Cl. .......... 345/98; 345/531; 345/560; 345/544; 365/230.06; 365/189.04

(58) Field of Classification Search .................... 345/98, 345/103, 530, 531, 560, 544; 365/189, 230
See application file for complete search history.

(56) References Cited

U.S. PATENT DOCUMENTS 6,317,165 B1 * 11/2001 Balram et al. ................ 348/699
2004/0160850 A1 8/2004 Son
2004/0264259 A1 * 12/2004 Hayashi et al. .......... 365/189.05
2005/0001846 A1 * 1/2005 Shiono .......................... 345/531

FOREIGN PATENT DOCUMENTS

JP 2003-202544 7/2003
JP 2005-031451 2/2005
KR 1020050077685 A 8/2005
TW 1229838 3/2005

OTHER PUBLICATIONS

Preliminary Notice of the First Office Action issued by the Taiwan Patent Office on Aug. 25, 2011, for TW Application No. 096105262.

* cited by examiner

*Primary Examiner* — Amr Awad
*Assistant Examiner* — Randal Willis
(74) *Attorney, Agent, or Firm* — Harness, Dickey & Pierce, P.L.C.

(57) ABSTRACT

A driving integrated circuit and methods thereof are provided. The driving IC includes a memory for driving a display panel and having a memory structure including at least one cell block, a scan register receiving data read from the memory, a source driver receiving data output from the scan register and outputting the received latched data to the panel and a switching unit establishing a connection between an activated cell block and the scan register in response to an activation of the activated cell block. One method includes performing a read operation to read data from a memory, the read operation including sensing and amplifying data stored within a memory cell, turning on a switch to increase a bit line voltage above a voltage threshold and latching the amplified data received through a line connected to the switch and transmitting the read data to the panel of the display device.

20 Claims, 4 Drawing Sheets

DRIVING INTEGRATED CIRCUIT AND METHODS THEREOF

PRIORITY STATEMENT

This application claims the benefit of Korean Patent Application No. 10-2006-0018425, filed on Feb. 24, 2006, in the Korean Intellectual Property Office, the disclosure of which is incorporated herein in its entirety by reference.

BACKGROUND OF THE INVENTION

1. Field of the Invention

Example embodiments of the present invention are directed generally to a driving integrated circuit (IC) and methods thereof, and more particularly to a driving IC and methods of driving a display panel.

2. Description of the Related Art

A liquid crystal display (LCD) may be deployed within notebook computers, cellular phones, monitors and so on. Conventional LCDs may include a panel for displaying images, and the panel may include a plurality of pixels. The plurality of pixels may be formed at respective intersections of a plurality of scan lines transferring a gate select signal and a plurality of data lines transferring color data (e.g., gradation data).

A driving integrated circuit (IC) for driving a display device, such as a LCD, may be designed such that a scan driver for driving the scan lines, a source driver for driving the data lines, and a memory storing data for driving the panel may be integrated in a single chip.

As a picture quality (e.g., resolution) of a display device increases, the memory included in the driving IC may require a higher capacity. A conventional driving IC may typically include a static random access memory (SRAM) having a memory cell structure of 6-TR or 8-Tr.

As the graphics standard of a mobile display device (e.g., a LCD display) transitions from QVGA to VGA, a memory included in a driving IC for driving the mobile display device may require a higher degree of integration. However, a conventional 6-TR SRAM structure may not be suitable for higher degrees of integration.

SUMMARY OF THE INVENTION

An example embodiment of the present invention is directed to a driving integrated circuit (IC), including a memory storing data for driving a panel of a display device and having a memory structure including at least one cell block, a scan register receiving data read from the memory and latching the received read data, a source driver receiving data output from the scan register and outputting the received latched data to the panel and a switching unit selectively establishing a connection between an activated cell block and the scan register in response to an activation of the activated cell block, the activated cell block included among the at least one cell block of the memory.

Another example embodiment of the present invention is directed to a method of driving a display device, including performing a read operation to read data from a memory, the read data configured to drive a panel of the display device, the read operation including sensing and amplifying data stored within a memory cell of the memory, turning on a switch to increase a bit line voltage above a voltage threshold and latching the sensed and amplified data received through a line connected to the switch and transmitting the read data to the panel of the display device.

Another example embodiment of the present invention is directed to a method of driving a display device, including receiving data from a memory, the received data associated with driving a panel of a display device and the memory including at least one cell block, selectively establishing a connection between a given cell block, among the at least one cell block of the memory device, and a scan register, in response to an activation of the given cell block during a read operation such that the received data is received from the memory via the connection, latching the received read data and transferring the latched read data to the panel of the display device.

Another example embodiment of the present invention is directed to a driving IC for a display device including a highly integrated memory storing data for driving a panel to improve the degree of integration of the driving IC and a driving method thereof.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
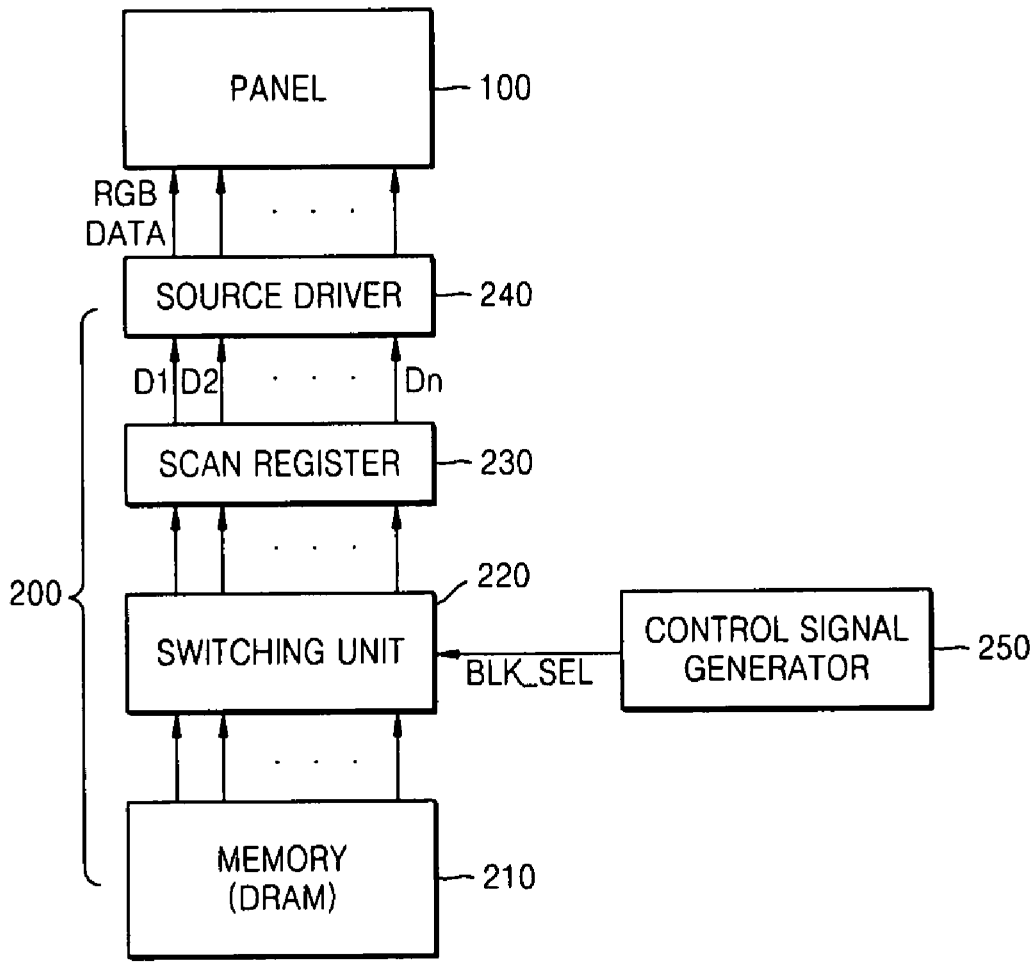
FIG. 1 is a block diagram illustrating a driving integrated circuit (IC) for a display device according to an example embodiment of the present invention.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a driving integrated circuit (IC) 200 for a display device according to an example embodiment of the present invention. In the example embodiment of FIG. 1, the driving IC 200 may drive a panel 100 and may include a memory 210, a switching unit 220, a scan register 230 and a source driver 240. The driving IC 200 may further include a control signal generator 250 for generating a control signal BLK_SEL for controlling a switching operation of the switching unit 220.

In the example embodiment of FIG. 1, the memory 210 may include a dynamic random access memory (DRAM) structure configured to store data for driving the panel 100 and may include at least one cell block. In an example, each of a plurality of memory cells included in the DRAM may include a single transistor and a single capacitor.

In the example embodiment of FIG. 1, data may be transmitted to the panel 100 to drive the panel 100 in response to gradation of the data. Accordingly, data stored in the memory 210 may thereby be periodically read, wherein data stored in a memory cell connected to an activated word line may be sensed, amplified and transmitted to the scan register 230.

In the example embodiment of FIG. 1, the memory 210 (e.g., having a DRAM structure) may transmit the data after the data of the memory cell is sensed and amplified and the voltage of a bit line pair rises above a voltage threshold. The switching unit 220 may be connected between the memory 210 and the scan register 230 and may be switched after a given delay period (e.g., after a data sensing operation is carried out) to transmit the data read from the memory 210 to the scan register 230.

In the example embodiment of FIG. 1, to allow the switching unit 220 to perform the aforementioned operation, the control signal generator 250 may provide the control signal BLK_SEL to the switching unit 220. The control signal BLK_SEL may be transmitted to the switching unit 220 arranged in each of cell blocks of the memory 210 and may turn on the switching unit 220 after a given delay period after an operation of reading data from an activated cell block is started or initiated.

In the example embodiment of FIG. 1, the scan register 230 may receive the data read from the memory 210, may latch the received data and may output the data to the source driver 240. The data D1 through Dn output from the scan register 230 may be converted into an analog signal in the source driver 240 and the analog signal may be transmitted to the panel 100 as R, G and B gradation data RGB DATA.

The control signal generator 250 illustrated in the example embodiment of FIG. 1 will now be explained in greater detail with reference to FIG. 2.

Figure 2:
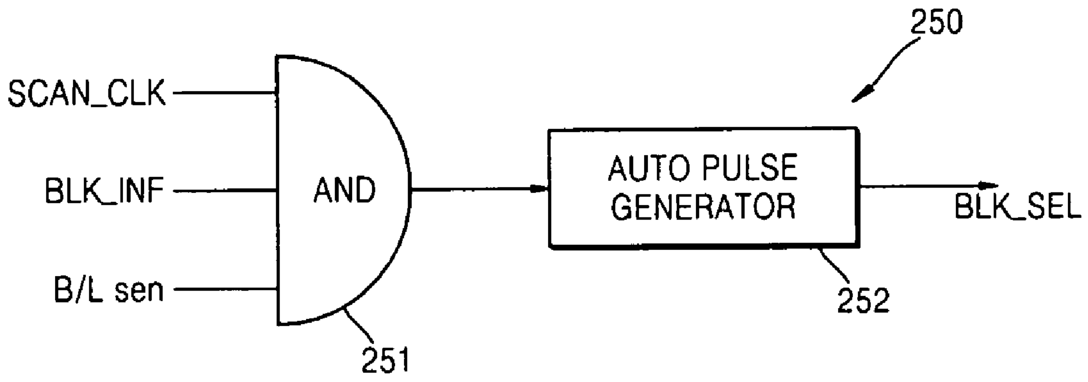
FIG. 2 is a block diagram illustrating a control signal generator according to another example embodiment of the present invention.

FIG. 2 is a block diagram illustrating the control signal generator 250 of FIG. 1 according to another example embodiment of the present invention. In the example embodiment of FIG. 2, the control signal generator 250 may generate the control signal BLK_SEL for controlling the switching unit 220 connected to an activated cell block to be switched. The control signal generator 250 may include an AND gate 251 and an auto pulse generator 252.

In the example embodiment of FIG. 2, a signal B/L sen (e.g., including sense amplifier operation completion information), a signal BLK_INF (e.g., including information of an activated cell block) and a scan clock signal SCAN_CLK may be input to respective input terminals of the AND gate 251 such that the switching unit 220 connected to the activated cell block may be turned on after a given delay period following a start-point or initiation of a read operation. The AND gate 251 of the control signal generator 250 may perform a logic AND operation on the signal B/L sen, the signal BLK_INF and the scan clock signal SCAN_CLK such that the switching unit 220 may be turned on after the voltage of the bit line pair rises above a voltage threshold (e.g., a voltage threshold sufficient for the AND gate 251 to treat the bit line voltage as a higher logic level or logic "1"). In an example, the scan clock signal SCAN_CLK may be input from an external controller (not shown) and may have a waveform enabled after a given period following a receipt of a read command.

In the example embodiment of FIG. 2, the auto pulse generator 252 may receive the signal output from the AND gate 251 and may generate an auto pulse signal. In an example, the switching unit 220 may be turned on for a limited duration to reduce or prevent signal leakage. The signal output from the auto pulse generator 252 may be provided to the switching unit 220 as the control signal BLK_SEL.

Figure 3:
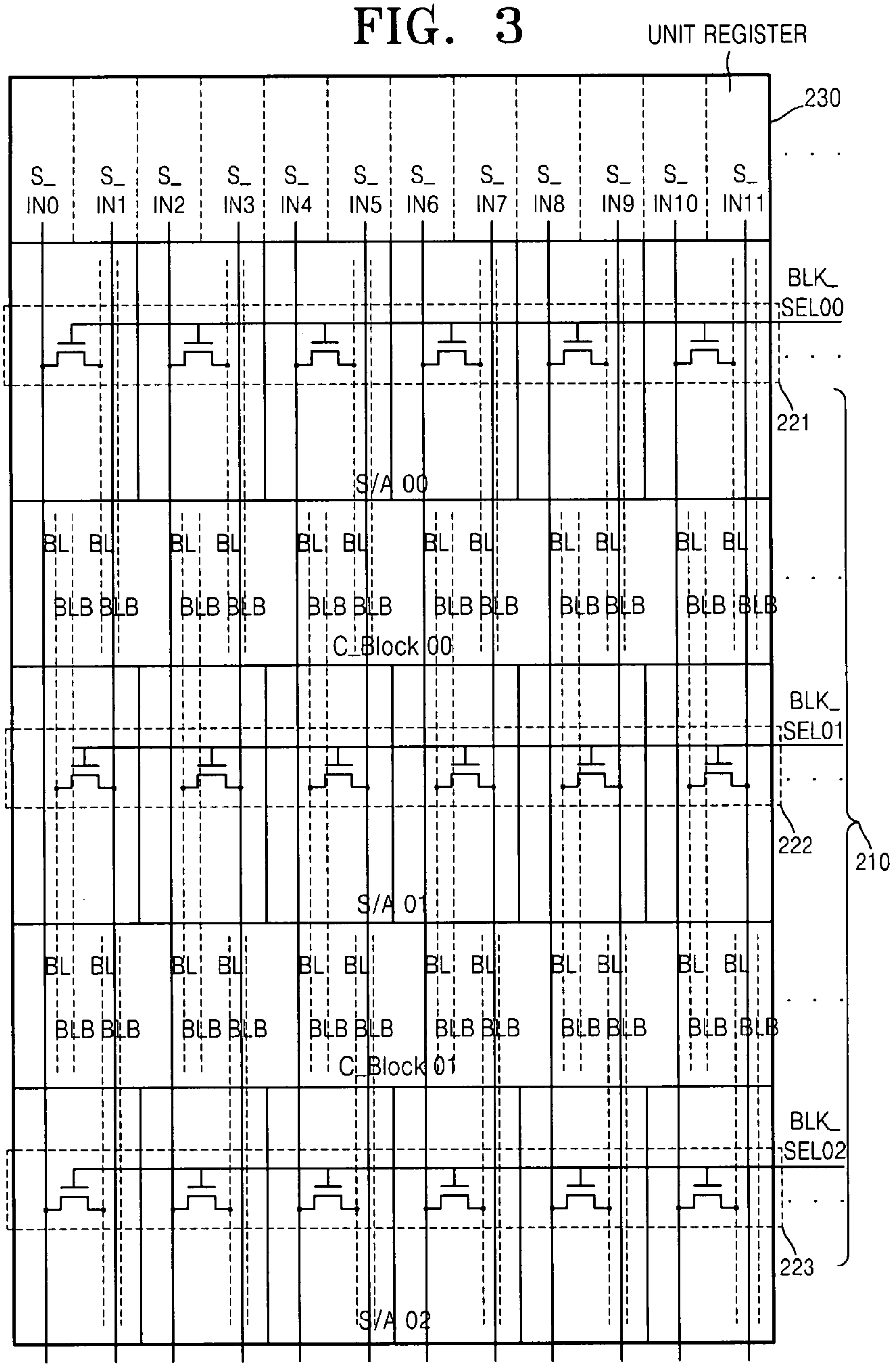
FIG. 3 is a circuit diagram illustrating the driving IC of FIG. 1 according to another example embodiment of the present invention.

FIG. 3 is a circuit diagram illustrating the driving IC 200 of FIG. 1 according to another example embodiment of the present invention. As shown in FIG. 3, the driving IC 200 may include the memory 210, switching units 221, 222 and 223, and the scan register 230. The memory 210 may include a plurality of cell blocks C_Block00, C_Block01 and a plurality of sense amplifiers S/A00, S/A01 and S/A02 arranged in proximity to the cell blocks C_Block00, C_Block01 to sense and amplify data.

In the example embodiment of FIG. 3, the cell block C_Block00 and C_Block01 and the sense amplifiers S/A00, S/A01 and S/A02 may have a staggered structure. If the cell block C_Block00 is activated, the sense amplifiers S/A00 and S/A01 may likewise be activated to read data stored in the memory cells of the cell block C_Block00.

In the example embodiment of FIG. 3, the activated sense amplifiers S/A00 and S/A01 may develop voltages of bit line pairs corresponding to memory cells from which data may be read by the activated sense amplifiers S/A00 and S/A01. The sense amplifier S/A00 may sense and amplify data stored in a given memory cell of the cell block C_Block00 and the sense amplifier S/A01 may sense and amplify data stored in a memory cell adjacent to the given memory cell if the cell blocks and the sense amplifiers are arranged in the staggered structure.

In the example embodiment of FIG. 3, the switching units 221, 222 and 223 may be respectively connected to the sense amplifiers S/A00, S/A01 and S/A02 and may transmit the data sensed and amplified by the sense amplifiers S/A00, S/A01 and S/A02 to the scan register 230. For example, the switching unit 221 may be connected to the sense amplifier S/A00 to transmit the data sensed and amplified by the sense amplifier S/A00. The switching unit 222 may be connected to the sense amplifier S/A01 to transmit the data sensed and amplified by the sense amplifier S/A01. The switching unit 223 may be connected to the sense amplifier S/A02 to transmit the data sensed and amplified by the sense amplifier S/A02. If the cell block C_Block00 is activated, the sense amplifiers S/A00 and S/A01 may be activated to read data of the memory cells of the cell block C_Block00 and the switching units 221 and 222 corresponding to the sense amplifiers S/A00 and S/A01 may be turned on. However, the sense amplifier S/A02 may be inactivated, and thus the switching unit 223 connected to the sense amplifier S/A02 may be turned off.

In the example embodiment of FIG. 3, each of the switching units 221, 222 and 223 may include a plurality of switches. In an example, each of the plurality of switches may be embodied as a transistor. In an example, the transistor may be an NMOS transistor (e.g., as illustrated in FIG. 3).

In the example embodiment of FIG. 3, a first electrode of each of the plurality of NMOS transistors included in each of the switching units 221, 222 and 223 may be connected to one of bit lines of a bit line pair and a second electrode thereof may be connected to the scan register 230. The gate of each of the plurality of NMOS transistors may receive a control signal. For example, a control signal BLK_SEL00 may be applied to the gates of the NMOS transistors included in the switching unit 221, and a control signal BLK_SEL01 may be applied to the gates of the NMOS transistors included in the switching unit 222. A control signal BLK_SEL02 may be applied to the gates of the NMOS transistors included in the switching unit 223.

In the example embodiment of FIG. 3, if the cell block C_Block00 is activated, the switching units 221 and 222 may be turned on and the switching unit 223 may be turned off, as described above. Thus, the control signals BLK_SEL00 and BLK_SEL01 may be enabled (e.g., set to a first logic level, such as a higher logic level or logic "1") to turn on the NMOS transistors of the switching units 221 and 222 and the control signal BLK_SEL02 may be maintained at a second logic level (e.g., a lower logic level or logic "0") to turn off the NMOS transistors of the switching unit 223. The control signals BLK_SEL00 and BLK_SEL01 may be enabled (e.g., set to the first logic level) after a given delay period following the data sensing operations of the sense amplifiers S/A00 and S/A01 such that data may be transmitted to the scan register 230 after the bit line pairs rise above a voltage threshold (e.g., responsive to the sense amplifiers S/A00 and S/A01 performing the sensing amplification operations).

In the example embodiment of FIG. 3, the scan register 230 may include a plurality of unit registers. Each of the unit registers may be connected to one of the bit lines of a bit line pair through the NMOS transistor. Accordingly, the plurality of unit registers may respectively receive data transmitted from the bit line pairs through input ports S_IN0 through S_IN11 if the NMOS transistors are turned on. In an example, the number of the unit registers included in the scan register 230 may be equal to the number of bit line pairs included in the memory cell blocks. Accordingly, data stored in the cell blocks may be transmitted to the scan register 230 and the scan register 230 may latch the data and output the data to the source driver (not illustrated in FIG. 3) in parallel.

Figure 4:
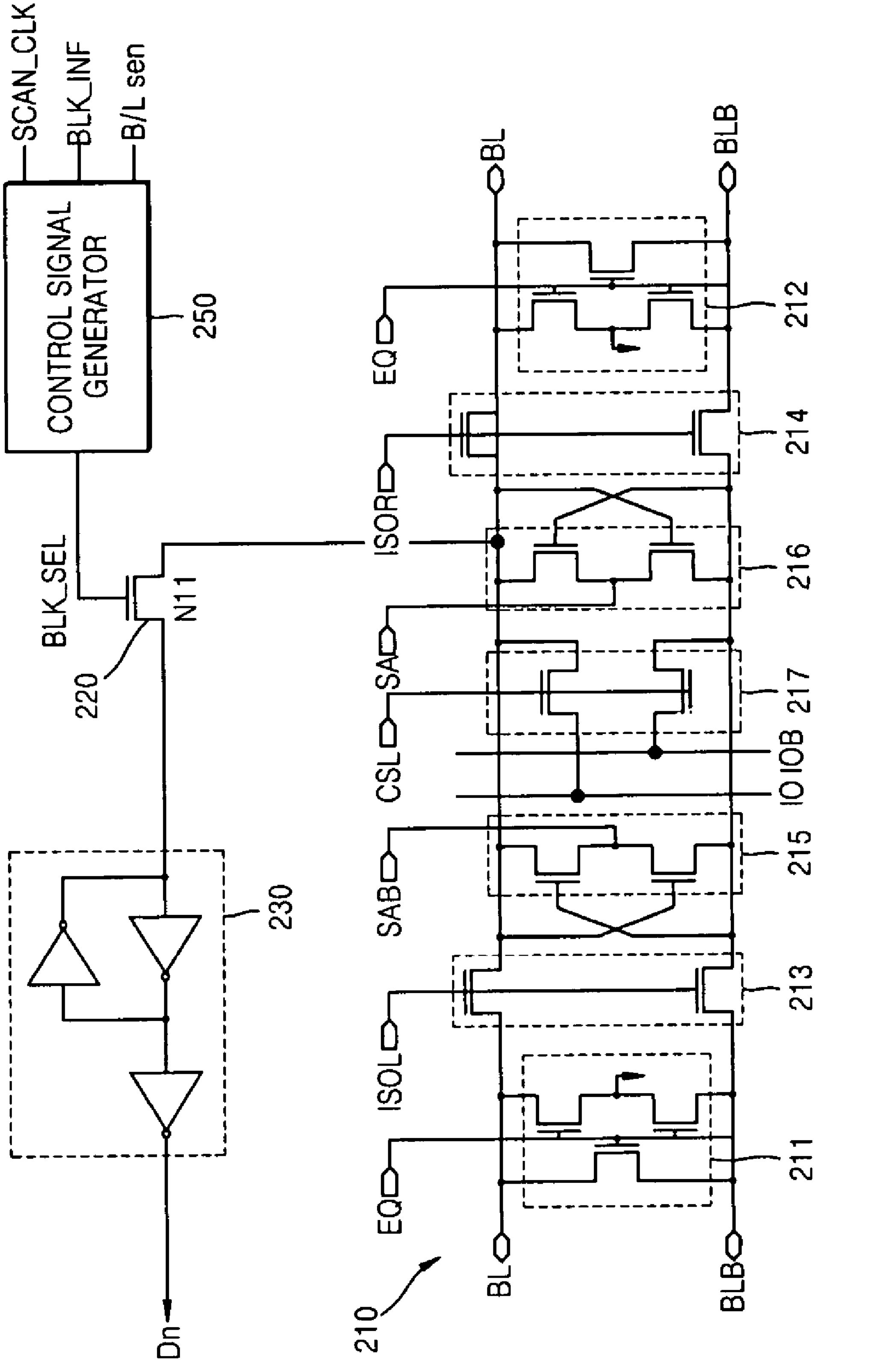
FIG. 4 is a circuit diagram illustrating data read and latch operations of the driving IC of FIGS. 1 and 3 according to another example embodiment of the present invention.

FIG. 4 is a circuit diagram illustrating data read and latch operations of the driving IC 200 of FIGS. 1 and 3 according to another example embodiment of the present invention. In the example embodiment of FIG. 4, the memory 210 (e.g., having a DRAM structure) may include equalizers 211 and 212 connected to a bit line pair BL and BLB, sense amplifiers 215 and 216 for developing the voltages of the bit line pair, connection controllers 213 and 214 for controlling the connection of memory cells and the sense amplifiers 215 and 216, and a column select gate pair 217 for controlling the connection of the bit line pair BL and BLB and data input/output lines IO and IOB to read data stored in memory cells.

In the example embodiment of FIG. 4, the equalizers 211 and 212 may pre-charge the voltages of the bit line pair BL and BLB (e.g., to the same level) in response to an equalization control signal EQ. The connection controllers 213 and 214 may control the connection of memory cells activated to read data and the sense amplifiers 215 and 216 in response to connection control signals ISOL and ISOR.

In the example embodiment of FIG. 4, the sense amplifiers 215 and 216 may include a pull-down unit 215 and a pull-up unit 216. The pull-down unit 215 may pull down the bit line pair BL and BLB in response to a pull-down control signal SAB. The pull-up unit 216 may pull up the bit line pair BL and BLB in response to a pull-up control signal SA. The column select gate pair 217 may connect the bit line pair BL and BLB to the data input/output lines IO and IOB in response to a column select signal CSL and may transmit the data sensed and amplified by the sense amplifiers 215 and 216 through the data input/output lines IO and IOB.

In the example embodiment of FIG. 4, the data sensed and amplified by the sense amplifiers 215 and 216 may be transmitted to the scan register 230 through the switching unit 220. As shown in the example embodiment of FIG. 4, in an example, an NMOS transistor N11 may embody the switching unit 220. A first electrode of the NMOS transistor N11 may be connected to one of the bit lines BL and BLB of the memory 210 (e.g., BL) and a second electrode thereof may be connected to the scan register 230. The gate of the NMOS transistor N11 may receive the control signal BLK_SEL output from the control signal generator 250. The control signal generator 250 may receive the signal B/L sen (e.g., including sense amplifier operation completion information), the signal BLK_INF (e.g., having information associated with an activated cell block) and the scan clock signal SCAN_CLK to generate the control signal BLK_SEL.

In the example embodiment of FIG. 4, after the voltages of the bit line pair BL and BLB rise above a voltage threshold, the control signal BLK_SEL may be enabled (e.g., set to the first logic level) to turn on the NMOS transistor N11, and thus data read from the memory 210 may be transmitted to the scan register 230. The scan register 230 may include a plurality of inverters. An inverter that feeds back a signal input thereto may be included among the plurality of inverters. The scan register 230 may latch input data and may output data Dn to a source driver (not shown).

In the example embodiment of FIG. 4, the switching unit 220 and the scan register 230 may perform the aforementioned operations for a plurality of bit line pairs included in activated cell blocks, and thus data may be latched by the scan register 230 and output. Accordingly, the scan register 230 may latch input data and may output the data to the source driver in parallel.

Figure 5:
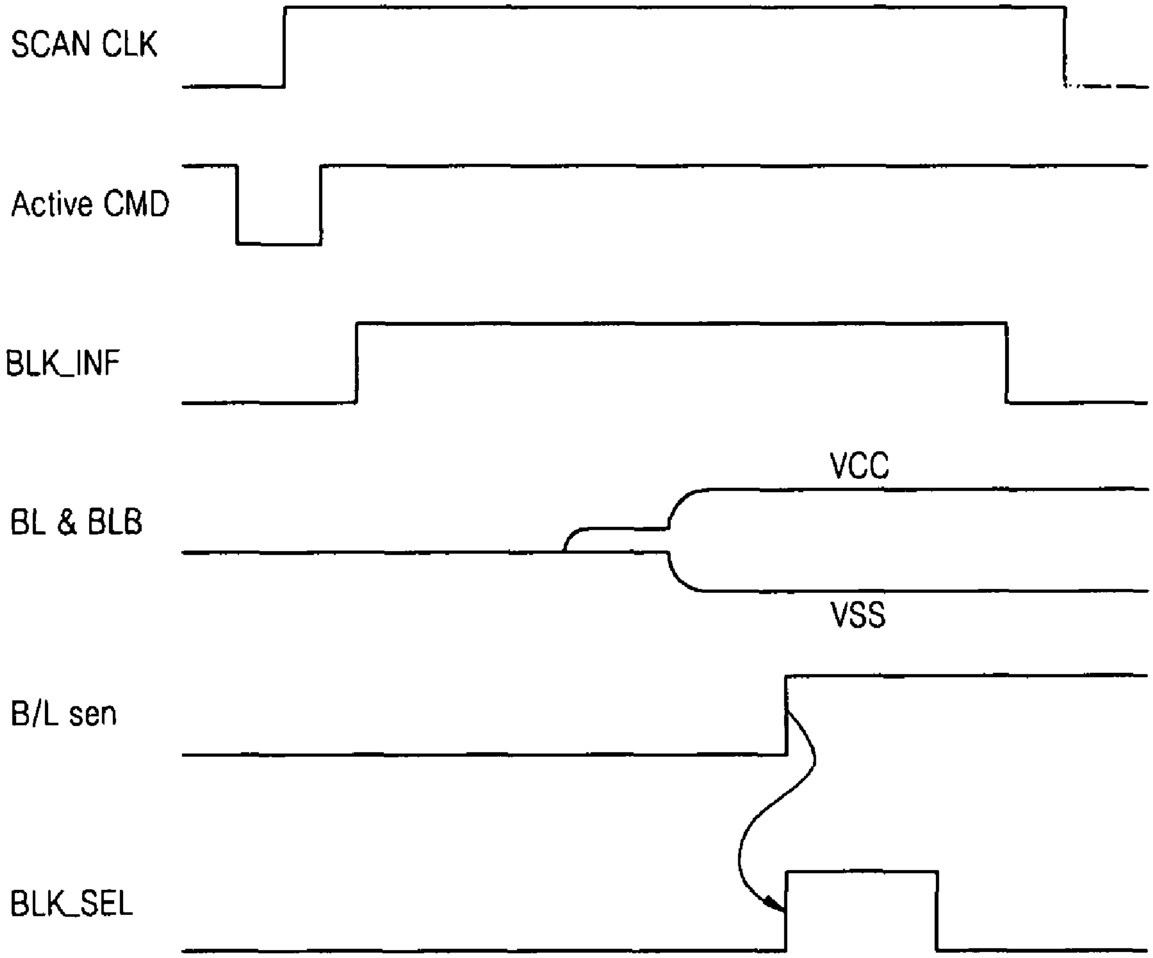
FIG. 5 is a waveform diagram illustrating an operation of the driving IC of FIG. 1 according to another example embodiment of the present invention.

FIG. 5 is a waveform diagram illustrating an operation of the driving IC 200 of FIG. 1 according to another example embodiment of the present invention. In the example embodiment of FIG. 5, if a data read command is input to a given cell block of the memory 210, an active signal Active CMD for activating memory cells of the cell block may be enabled. In addition, the scan clock signal SCAN_CLK and the block information signal BLK_INF (e.g., having information associated with an activated cell block) may be enabled (e.g., set to the first logic level). If the cell blocks of the memory 210 and the sense amplifiers have a staggered structure (e.g., as illustrated in the example embodiment of FIG. 3), the block information signal BLK_INF for generating the control signals BLK_SEL00 and BLK_SEL01 may be enabled (e.g., set to the first logic level) if the cell block C_Block00 is activated.

In the example embodiment of FIG. 5, if the sense amplifiers perform a sensing operation so as to increase the voltages of the bit line pairs above a voltage threshold, the signal B/L sen (e.g., including sense amplifier operation completion information) may be enabled (e.g., transitioned to the first logic level, such as a higher logic level or logic "1"), and thus the control signal BLK_SEL may likewise be enabled. In an example, if the control signal generator includes an auto pulse generator, the control signal BLK_SEL may be enabled so as to have a given pulse width. For example, the block information signal BLK_INF for generating the control signals BLK_SEL00 and BLK_SEL01 may be enabled, and thus the switching unit 221 connected to the sense amplifier S/A00 to which the control signal BLK_SEL00 is input and the switching unit 222 connected to the sense amplifier S/A01 to which the control signal BLK_SEL01 is input may be turned on. Accordingly, data read from the cell block C_Block00 may be transmitted to the scan register 230 and then transmitted to the source driver in parallel.

In another example embodiment of the present invention, a driving IC for a display device may include a DRAM as a memory for storing gradation data to achieve higher integration. Furthermore, data transmission may be controlled so as to more stably transmit gradation data to a panel (e.g., a liquid display panel (LCD)).

Example embodiments of the present invention being thus described, it will be obvious that the same may be varied in many ways. For example, the first and second logic levels are above-described as corresponding to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A driving integrated circuit (IC), comprising:

a memory storing data for driving a panel of a display device and having a memory structure including at least one cell block;

a scan register receiving data read from the memory and latching the received read data;

a source driver receiving latched data output from the scan register and outputting gradation data to the panel;

a switching unit selectively establishing a connection between an activated cell block and the scan register in response to an activation of the activated cell block, the activated cell block included among the at least one cell block of the memory; and a control signal generator controlling whether the switching unit connected to the activated cell block is switched;

wherein the switching unit is switched after a given delay period subsequent to a data sensing operation being performed to transmit a voltage to the scan register at a level that supports a data operation, and wherein the control signal generator generates a control signal for switching the switching unit in response to a first signal including sense amplifier operation completion information, a second signal including information associated with the activated cell block, and a scan clock signal.

2. The driving IC of claim 1, wherein the memory structure is a dynamic random access memory (DRAM) structure, and wherein completely developed data of the DRAM is provided to the source driver through the scan register based on the control signal.

3. The driving IC of claim 1, wherein the memory includes:

a plurality of sense amplifiers setting voltages of a bit line pair to sense and amplify data stored in memory cells, wherein the switching unit is connected between one of the bit lines of the bit line pair and the scan register.

4. The driving IC of claim 1, wherein the scan register includes:

a plurality of unit registers respectively receiving data from a plurality of bit line pairs included in the at least one cell block.

5. The driving IC of claim 1, wherein the control signal generator includes:

an AND gate receiving the first and second signals and the scan clock signal and performing a logic AND operation on the received signals to output an ANDed signal.

6. The driving IC of claim 5, wherein the control signal generator further includes:

an auto pulse generator generating an auto pulse signal having a given pulse width in response to the ANDed signal and providing the auto pulse signal to the switching unit.

7. The driving IC of claim 5, wherein the panel is a liquid crystal display (LCD) panel.

8. A display device, comprising:

the driving IC of claim 1;

the panel receiving display information from the driving IC and displaying an image corresponding to the received display information.

9. A method of driving a display device, the method comprising:

performing a read operation to read data from a memory, the read data configured to drive a panel of the display device, the read operation including, sensing and amplifying data stored within a memory cell of the memory, turning on a switch after a given delay period subsequent to the sensing to increase a bit line voltage above a voltage threshold, and latching the sensed and amplified data received through a line connected to the switch; and transmitting gradation data to the panel of the display device;

wherein turning on the switch is performed in response to a first signal including sense amplifier operation completion information, a second signal including information of an activated cell block of the memory, and a scan clock signal.

10. The method of claim 9, wherein the memory is a dynamic random access memory (DRAM).

11. The method of claim 9, wherein the panel is a liquid crystal display (LCD) panel.

12. The method of claim 9, further comprising:

performing a logic AND operation on the first signal, the second signal, and the scan clock signal to output an ANDed signal.

13. The method of claim 12, further comprising:

generating an auto pulse signal having a given pulse width in response to the ANDed signal;

wherein turning on the switch is performed in response to the auto pulse signal.

14. A display device driven by the method of claim 9.

15. A method of driving a display device, the method comprising:

receiving data from a memory, the received data associated with driving a panel of the display device and the memory including at least one cell block;

selectively establishing a connection between a given cell block, among the at least one cell block of the memory device, and a scan register, in response to an activation of the given cell block during a read operation such that the received data is received from the memory via the connection, the connection being selectively established after a given delay period subsequent to receiving the data to transmit a voltage that supports a data operation;

latching the received read data; and transferring gradation data to the panel of the display device;

wherein selectively establishing the connection is performed in response to a first signal including sense amplifier operation completion information, a second signal including information of the given cell block, and a scan clock signal.

16. The method of claim 15, wherein the memory is a dynamic random access memory (DRAM).

17. The method of claim 15, wherein the panel is a liquid crystal display (LCD) panel.

18. The method of claim 15, further comprising:

performing a logic AND operation on the first signal, the second signal, and the scan clock signal to output an ANDed signal.

19. The method of claim 18, further comprising:

generating an auto pulse signal having a given pulse width in response to the ANDed signal;

wherein selectively establishing the connection is performed in response to the auto pulse signal.

20. A display device driven by the method of claim 15.

* * * * *